United States Patent
Ju et al.

(10) Patent No.: US 8,294,491 B2
(45) Date of Patent: Oct. 23, 2012

(54) HIGH SPEED FLIP-FLOP CIRCUIT AND CONFIGURATION METHOD THEREOF

(75) Inventors: In Kwon Ju, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/914,360

(22) Filed: Oct. 28, 2010

(65) Prior Publication Data
US 2011/0291701 A1 Dec. 1, 2011

(30) Foreign Application Priority Data
May 31, 2010 (KR) .................. 10-2010-0050938

(51) Int. Cl.
*G06F 7/38* (2006.01)
*H03K 19/096* (2006.01)
*H03K 19/20* (2006.01)
*H03K 3/356* (2006.01)
*H03K 3/037* (2006.01)

(52) U.S. Cl. ............. 326/46; 326/95; 326/119; 327/208; 327/225

(58) Field of Classification Search ............ 326/46, 326/54, 93, 95, 104, 112, 113, 119, 121; 327/171, 208–212, 214, 215, 224, 225, 291–297, 327/199
See application file for complete search history.

(56) References Cited

U.S. PATENT DOCUMENTS

| 4,939,384 A * | 7/1990 | Shikata et al. ............... 327/212 |
| 5,140,179 A * | 8/1992 | Takano ........................ 327/203 |
| 6,417,711 B2 * | 7/2002 | Fulkerson .................... 327/203 |
| 2003/0189451 A1 | 10/2003 | Ziesler et al. |
| 2004/0145389 A1 * | 7/2004 | Yu ................................. 326/115 |
| 2005/0151572 A1 * | 7/2005 | Ochoa et al. .................. 327/227 |
| 2008/0231335 A1 * | 9/2008 | Werking ....................... 327/175 |

FOREIGN PATENT DOCUMENTS
JP  2002-111451 A  4/2002
KR  2005-0053993 A  6/2005

OTHER PUBLICATIONS

Koutarou Tanaka et al., "8-Gb/s 8:1 Multiplexer and 1:8 Demultiplexer IC's Using GaAs DCFL Circuit", IEEE Journal of Solid-State Circuits, vol. 27, No. 10, p. 1359-1363, Oct. 1992.
"Novel HGH-Speed Flip-Flop Circuit With Low Power Consumption Using GaAs Junction FETs", Electronic Letters, vol. 27, No. 9, p. 764-765, Apr. 25, 1991.

* cited by examiner

*Primary Examiner* — Shawki Ismail
*Assistant Examiner* — Dylan White
(74) *Attorney, Agent, or Firm* — Rabin & Berdo, P.C.

(57) ABSTRACT

A high speed flip-flop circuit and a configuration method thereof are provided. A small number of transistors may be used to configure a flip-flop circuit, so that the flip-flop circuit may be operated at a high-speed. Additionally, an area occupied by the flip-flop circuit may be reduced, and power consumption may be reduced. Accordingly, the flip-flop circuit may be integrated together with a microwave frequency integrated circuit using a Gallium Arsenide (GaAs) compound semiconductor process.

8 Claims, 6 Drawing Sheets

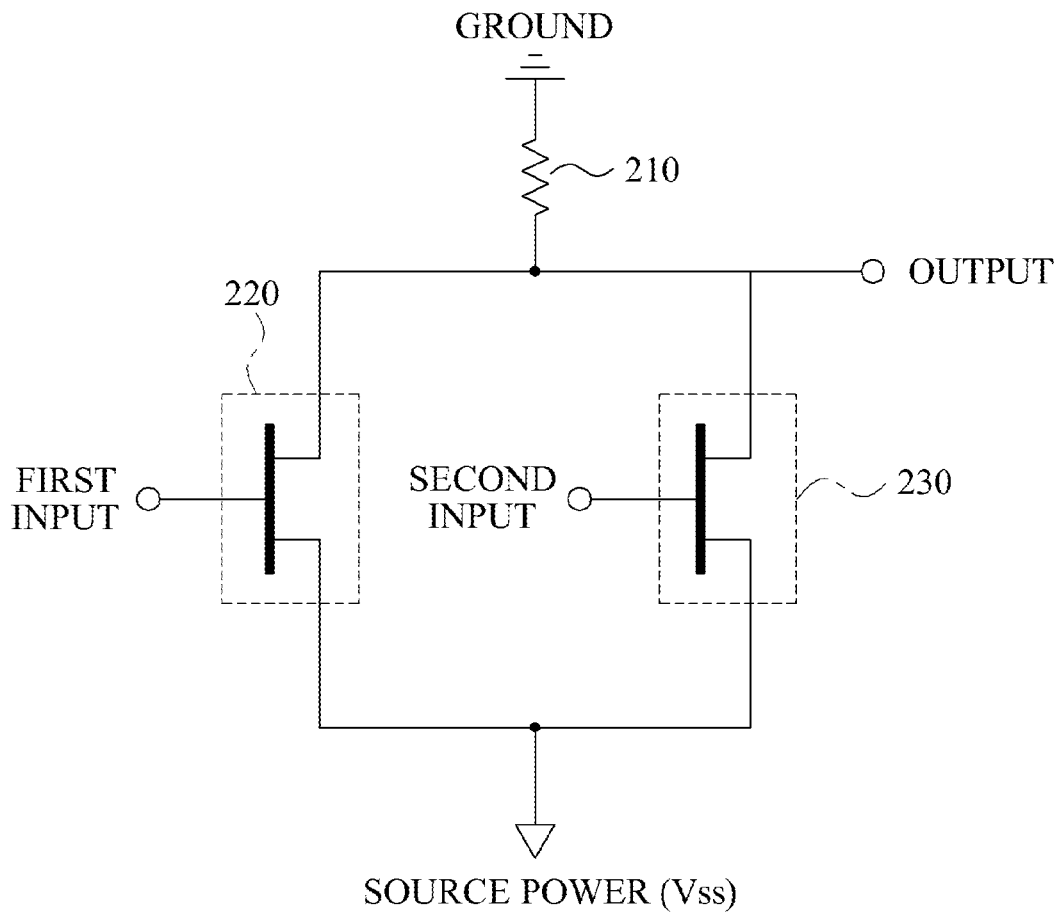

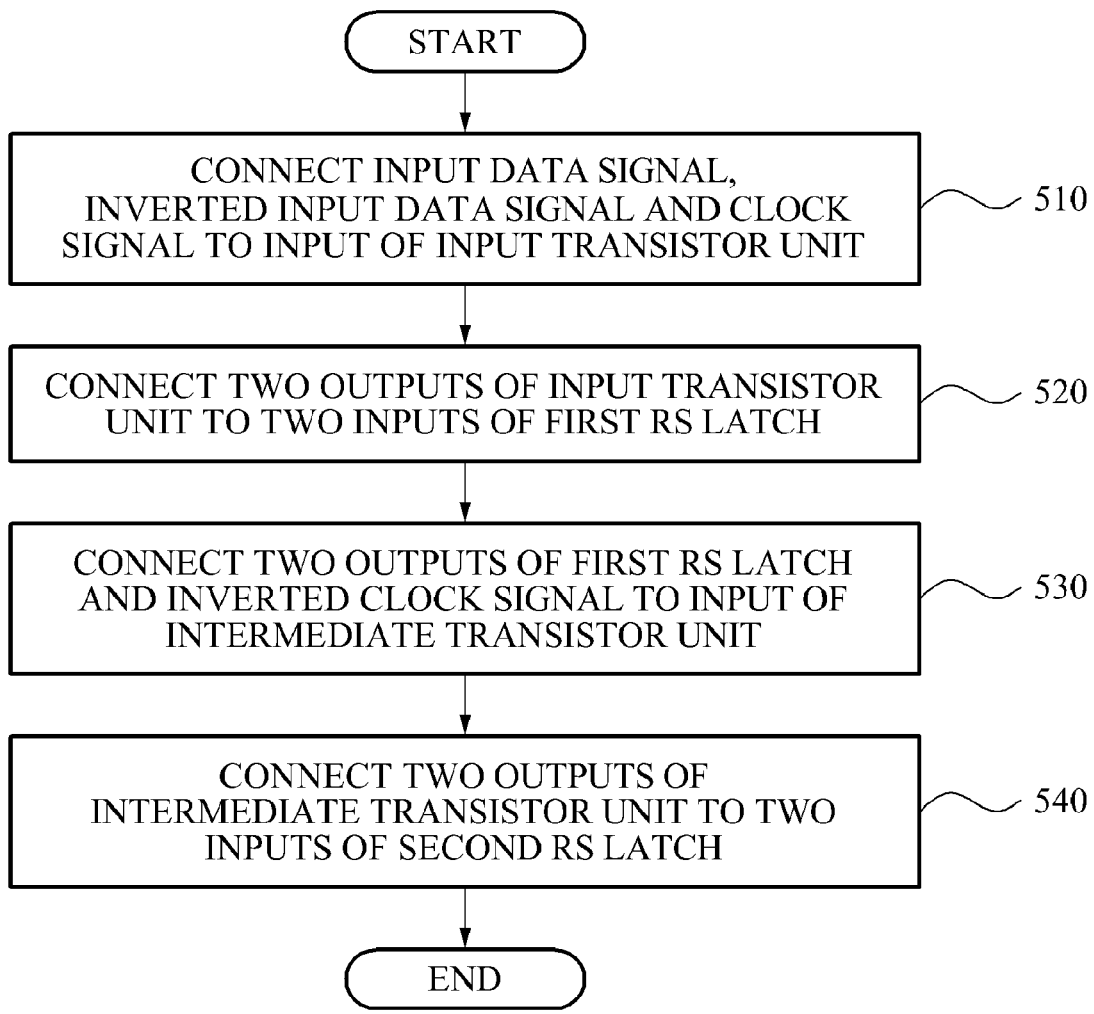

HIGH SPEED FLIP-FLOP CIRCUIT AND CONFIGURATION METHOD THEREOF

CROSS-REFERENCE TO RELATED APPLICATION

This application claims the benefit of Korean Patent Application No. 10-2010-0050938, filed on May 31, 2010, in the Korean Intellectual Property Office, the disclosure of which is incorporated herein by reference.

BACKGROUND

1. Field of the Invention

The present invention relates to a flip-flop circuit, and a method of configuring the flip-flop circuit.

2. Description of the Related Art

A flip-flop refers to a circuit widely used in digital circuits. The flip-flop may output stored data previously input in response to a clock signal. The flip-flop may be used in various semiconductor circuits.

The flip-flop is configured with a plurality of logical gates, such as NOR gates or inverters. Each of the logical gates includes a plurality of transistors and a plurality of resistances.

It is important to miniaturize an apparatus and reduce power consumption by reducing an area occupied by a circuit. Recently, various mobile devices are being reduced in size and power consumption.

Conventionally, a microwave frequency integrated circuit for processing a Radio Frequency (RF) signal is manufactured through a Gallium Arsenide (GaAs) process, and a digital integrated circuit, for example, a flip-flop circuit for controlling a microwave frequency integrated circuit, is manufactured as a separate chip through a Complementary Metal-Oxide-Semiconductor (CMOS) process. Accordingly, a size, a weight, and costs of the circuit may be increased.

SUMMARY

An aspect of the present invention provides a flip-flop circuit, and a method of configuring the flip-flop circuit that may be integrated together with a microwave frequency integrated circuit using a Gallium Arsenide (GaAs) compound semiconductor process and thus, the flip-flop circuit may be operated at a high speed and may occupy a smaller area by minimizing a number of internal transistors.

According to an aspect of the present invention, there is provided a flip-flop including: a first RS latch; a second RS latch; an input transistor unit to receive, as inputs, an input data signal, an inverted input data signal, and a clock signal, and to provide two outputs to the first RS latch when being connected to an input port of the first RS latch, the input transistor unit including at least two transistors; and an intermediate transistor unit to receive, as inputs, two outputs of the first RS latch and an inverted clock signal, and to provide two outputs to the second RS latch when being connected to an input port of the second RS latch, the intermediate transistor unit including at least two transistors.

Each of the first RS latch and the second RS latch may use a NOR gate. The NOR gate may include a resistance connected between a ground and an output of the NOR gate; a fifth transistor to receive, as input, a first input through a gate of the fifth transistor, the fifth transistor being connected between a source power $V_{ss}$ and the output of the NOR gate; and a sixth transistor to receive, as input, a second input through a gate of the sixth transistor, the sixth transistor being connected between the source power $V_{ss}$ and the output of the NOR gate.

The input transistor unit may include a first transistor to receive, as input, the clock signal through a gate of the first transistor, the first transistor being connected between the input data signal and a first output of the input transistor unit; and a second transistor to receive, as input, the clock signal through a gate of the second transistor, the second transistor being connected between the inverted input data signal and a second output of the input transistor unit.

The intermediate transistor unit may include a third transistor to receive, as input, the inverted clock signal through a gate of the third transistor, the third transistor being connected between a first output of the first RS latch and a first output of the intermediate transistor unit; and a fourth transistor to receive, as input, the inverted clock signal through a gate of the fourth transistor, the fourth transistor being connected between a second output of the first RS latch and a second output of the intermediate transistor unit.

The first RS latch may receive, as inputs, two outputs of the input transistor unit through a set port and a reset port, and may provide an output of an output port and an output of an inverted output port to two inputs of the intermediate transistor unit.

The first RS latch may use a NOR gate. The reset port may be connected to the first output of the input transistor unit, the first output corresponding to the input data signal that is input to the input transistor unit, and the set port may be connected to the second output of the input transistor unit, the second output corresponding to the inverted input data signal that is input to the input transistor unit.

The second RS latch may receive, as inputs, two outputs of the intermediate transistor unit through a set port and a reset port, and may output an output data signal and an inverted output data signal through an output port and an inverted output port.

The second RS latch may use a NOR gate. The reset port may be connected to the first output of the intermediate transistor unit, the first output corresponding to a signal of an output port of the first RS latch that is input to the intermediate transistor unit, and the set port may be connected to the second output of the intermediate transistor unit, the second output corresponding to a signal of an inverted output port of the first RS latch that is input to the intermediate transistor unit.

According to another aspect of the present invention, there is provided a method of forming a flip-flop, the method including: connecting an input data signal, an inverted input data signal, and a clock signal to an input of an input transistor unit, the input transistor unit including at least two transistors; respectively connecting two outputs of the input transistor unit to two inputs of a first RS latch; connecting two outputs of the first RS latch and an inverted clock signal to an input of an intermediate transistor unit, the intermediate transistor unit including at least two transistors; and respectively connecting two outputs of the intermediate transistor unit to two inputs of a second RS latch.

Each of the first RS latch and the second RS latch may use a NOR gate. The NOR gate may include a resistance connected between a ground and an output of the NOR gate; a fifth transistor to receive, as input, a first input through a gate of the fifth transistor, the fifth transistor being connected between a source power $V_{ss}$ and the output of the NOR gate; and a sixth transistor to receive, as input, a second input through a gate of the sixth transistor, the sixth transistor being connected between the source power $V_{ss}$ and the output of the NOR gate.

The connecting of the input data signal, the inverted input data signal, and the clock signal may include connecting a first transistor between the input data signal and a first output of the input transistor unit; connecting a second transistor between the inverted input data signal and a second output of the input transistor unit; and connecting the clock signal to a gate of the first transistor and a gate of the second transistor.

The connecting of the two outputs of the first RS latch and the inverted clock signal may include connecting a third transistor between a first output of the first RS latch and a first output of the intermediate transistor unit; connecting a fourth transistor between a second output of the first RS latch and a second output of the intermediate transistor unit; and connecting the inverted clock signal to a gate of the third transistor and a gate of the fourth transistor.

The respectively connecting of the two outputs of the input transistor unit may include connecting a reset port of the first RS latch to the first output of the input transistor unit, the first output corresponding to the input data signal that is input to the input transistor unit; and connecting a set port of the first RS latch to the second output of the input transistor unit, the second output corresponding to the inverted input data signal that is input to the input transistor unit. The first RS latch may use a NOR gate.

The respectively connecting of the two outputs of the intermediate transistor unit may include connecting a reset port of the second RS latch to the first output of the intermediate transistor unit, the first output corresponding to an output signal of the first RS latch that is input to the intermediate transistor unit; and connecting a set port of the second RS latch to the second output of the intermediate transistor unit, the second output corresponding to an inverted output signal of the first RS latch that is input to the intermediate transistor unit. The second RS latch may use a NOR gate.

EFFECT

According to embodiments of the present invention, a number of transistors that are used to configure a flip-flop may be reduced to operate the flip-flop at a high-speed, to reduce an area occupied by a semiconductor, and to reduce power consumption.

Additionally, according to embodiments of the present invention, a flip-flop may be integrated together with a microwave frequency integrated circuit using a Gallium Arsenide (GaAs) compound semiconductor process. Accordingly, it is possible to reduce a size, a weight, and manufacturing costs of a microwave frequency system, and to improve reliability of the microwave frequency system, without a need to manufacture, as a separate chip, a digital circuit for controlling the microwave frequency integrated circuit through a Complementary Metal-Oxide-Semiconductor (CMOS) process.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 2 is a diagram illustrating an example of a NOR gate used in a first RS latch or a second RS latch;

FIG. 5 is a flowchart illustrating a method of configuring a flip-flop circuit according to an embodiment of the present invention.

DETAILED DESCRIPTION

Figure 1:
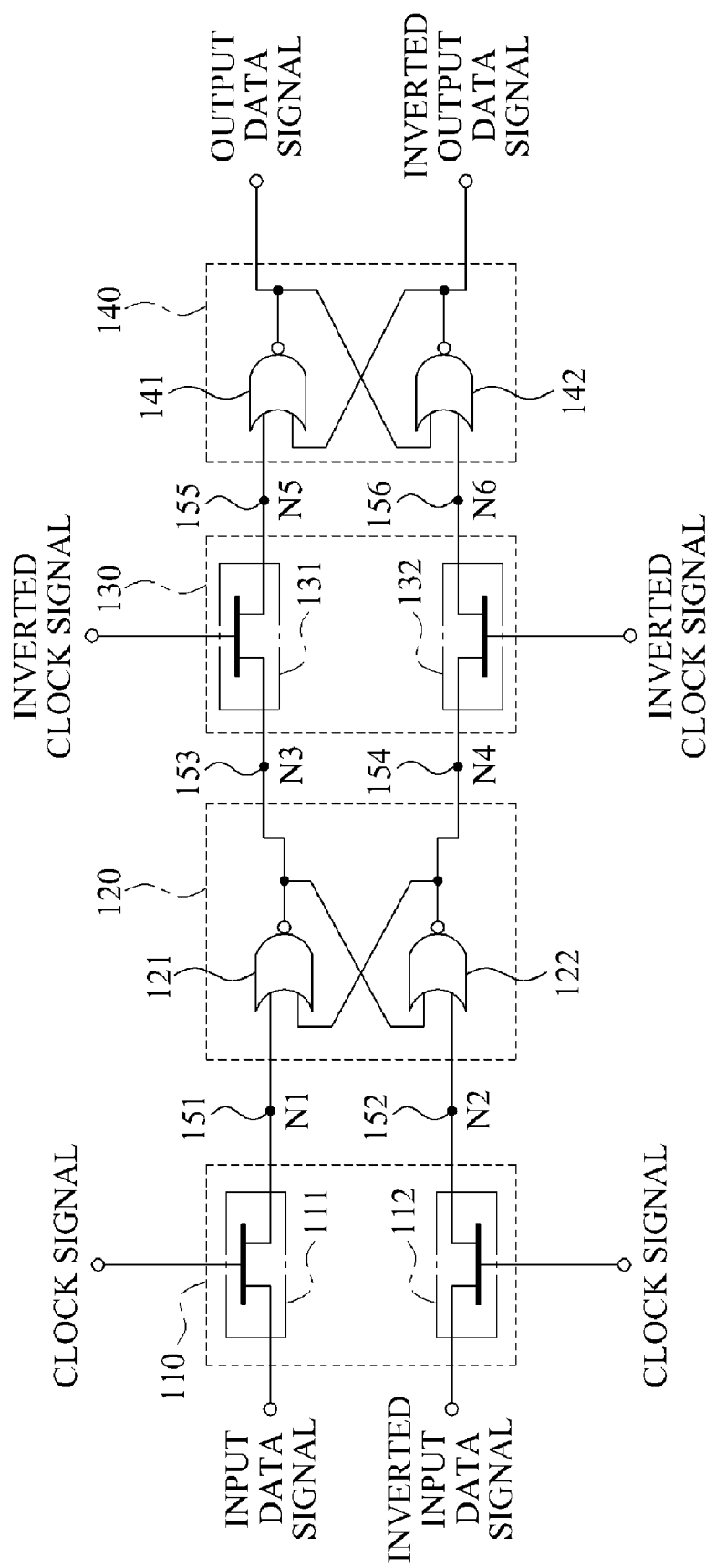
FIG. 1 is a diagram illustrating a flip-flop according to an embodiment of the present invention.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

FIG. 1 is a diagram illustrating a flip-flop according to an embodiment of the present invention.

Referring to FIG. 1, the flip-flop includes an input transistor unit 110, a first RS latch 120, an intermediate transistor unit 130, and a second RS latch 140.

The flip-flop of FIG. 1 may receive, as inputs, an input data signal, an inverted input data signal, a clock signal, and an inverted clock signal, and may output an output data signal and an inverted output data signal.

The input transistor unit 110 includes a first transistor 111, and a second transistor 112.

The first transistor 111 may be connected between the input data signal and a first output of the input transistor unit 110, and may receive, as input, a clock signal through a gate of the first transistor 110. The first output of the input transistor unit 110 may be transferred to a reset port of the first RS latch 120 through a node N1 151.

The second transistor 112 may be connected between the inverted input data signal and a second output of the input transistor unit 110, and may receive, as input, a clock signal through a gate of the second transistor 112. The second output of the input transistor unit 110 may be transferred to a set port of the first RS latch 120 through a node N2 152.

The first RS latch 120 may receive, as inputs, two signals, and may generate two outputs. The first RS latch 120 may receive, as inputs, the first output and the second output of the input transistor unit 110 through the set port and the reset port, and may provide the two outputs to two inputs of the intermediate transistor unit 130 through an output port and an inverted output port.

The first RS latch 120 may be configured with NOR gates. Here, the first RS latch 120 may include a first NOR gate 121, and a second NOR gate 122. The reset port of the first RS latch 120 may be a port connected to the node N1 151 between two input ports of the first NOR gate 121, and the set port of the first RS latch 120 may be a port connected to the node N2 152 between two input ports of the second NOR gate 122. The output port of the first RS latch 120 may be used to provide an output corresponding to the reset port of the first RS latch 120, and may be connected to a node N3 153. The inverted output port of the first RS latch 120 may be used to provide an output corresponding to the set port of the first RS latch 120, and may be connected to a node N4 154.

The first RS latch 120 may be configured with NAND gates, instead of NOR gates.

The intermediate transistor unit 130 includes a third transistor 131, and a fourth transistor 132.

The third transistor 131 may be connected between the output port of the first RS latch 110 and a first output of the intermediate transistor unit 130, and may receive, as input, an inverted clock signal through a gate of the third transistor 131. The first output of the intermediate transistor unit 130 may be transferred to a reset port of the second RS latch 140 through a node N5 155.

The fourth transistor 132 may be connected between the inverted output port of the first RS latch 110 and a second output of the intermediate transistor unit 130, and may receive, as input, an inverted clock signal through a gate of the fourth transistor 132. The second output of the intermediate transistor unit 130 may be transferred to a set port of the second RS latch 140 through a node N6 156.

The second RS latch 140 may receive, as inputs, two signals, and may generate two outputs. The second RS latch 140 may receive, as inputs, the first output and the second output of the intermediate transistor unit 130 through the set port and the reset port, and may output an output data signal and an inverted output data signal through an output port and an inverted output port. The output data signal and the inverted output data signal may be entire outputs of the flip-flop circuit.

The second RS latch 140 may be configured with NOR gates. Here, the second RS latch 140 may include a third NOR gate 141 and a fourth NOR gate 142. The reset port of the second RS latch 140 may be a port connected to the node N5 155 between two input ports of the third NOR gate 141, and the set port of the second RS latch 140 may be a port connected to the node N6 156 between two input ports of the fourth NOR gate 142. The output port of the second RS latch 140 may be used to provide an output corresponding to the reset port of the second RS latch 140. The inverted output port of the second RS latch 140 may be used to provide an output corresponding to the set port of the second RS latch 140.

The second RS latch 140 may be configured with NAND gates, instead of NOR gates.

Hereinafter, an operation of the flip-flop circuit configured as described above will be described.

In one example, assuming that an input data signal and an inverted input data signal are at a high level (hereinafter, referred to as "H") and in a low level (hereinafter, referred to as "L"), respectively, when a clock signal and an inverted clock signal are at "H" and "L", respectively, the first transistor 111 and the second transistor 112 may be turned on, and the third transistor 131 and the fourth transistor 132 may be turned off. Accordingly, the input data signal and the inverted input data signal may be respectively transmitted to the nodes N1 151 and N2 152, so that the nodes N1 151 and N2 152 may respectively become "H" and "L."

The NOR gate may enable an output to become "L" even when a single input is at "H" among a plurality of inputs is input. Accordingly, since the node N1 151 is at "H," the node N3 153 connected to the output port of the first NOR gate 121 may become "L." Additionally, since both of the nodes N2 152 and N3 153 as two inputs of the second NOR gate 122 are at "L," the node N4 154 connected to the inverted output port of the second NOR gate 122 may become "H."

Since the third transistor 131 and the fourth transistor 132 are turned off, a signal of the node N3 153 and a signal of the node N4 154 may not be transferred to the nodes N5 155 and N6 156.

Subsequently, when the clock signal is changed to "L," and when the inverted clock signal is changed to be at "H," the first transistor 111 and the second transistor 112 may be turned off, and the third transistor 131 and the fourth transistor 132 may be turned on. Accordingly, the signal of the node N3 153 and the signal of the node N4 154 may be transferred to the nodes N5 155 and N6 156, so that the nodes N5 155 and N6 156 may respectively become "L" and "H."

Since the first transistor 111 and the second transistor 112 are turned off, an output of the first NOR gate 121 and an output of the second NOR gate 122 may remain unchanged. Accordingly, a signal level of the node N5 155 and a signal level of the node N6 156 may be maintained. Since the node N6 156 is at "H," an output of the fourth NOR gate 142 may become "L," that is, may indicate an inverted output data signal of the flip-flop. Additionally, an output of the third NOR gate 141 may become "H," that is, may indicate an output data signal of the flip-flop.

Subsequently, when the clock signal is again changed to "H," and when the inverted clock signal is again changed to "L," the output of the third NOR gate 141 and the output of the fourth NOR gate 142 may remain unchanged. Accordingly, the output data signal and the inverted output data signal of the flip-flop may be maintained, until the clock signal becomes "L" and the inverted clock signal becomes "H."

In another example, when an input data signal and an inverted input data signal are at "L" and "H," respectively, an output data signal and an inverted output data signal may be obtained in a same manner as described above.

As described above, when the input data signal is at "H" when the clock signal is changed from "H" to "L," the output data signal may become "H." When the input data signal is at "L" when the clock signal is changed from "H" to "L," the output data signal may become "L." The output level of the output data signal may be maintained when the clock signal remains unchanged.

FIG. 2 is a diagram illustrating an example of a NOR gate used in a first RS latch or a second RS latch.

The NOR gate of FIG. 2 includes a resistance 210, a fifth transistor 220, and a sixth transistor 230, where the fifth transistor 220 and the sixth transistor 230 may be PMOS transistors.

The resistance 210 may be connected between a ground and an output of the NOR gate.

The fifth transistor 220 may receive, as input, a first input through a gate of the fifth transistor 220, and may be connected between a source power $V_{ss}$ and the output of the NOR gate.

The sixth transistor 230 may receive, as input, a second input through a gate of the sixth transistor 230, and may be connected between the source power $V_{ss}$ and the output of the NOR gate.

A power consumed by the NOR gate may be reduced by increasing the resistance 210.

For example, when both of the first input and the second input are at "L," the output of the NOR gate may become "H." Otherwise, the output of the NOR gate may become "L."

Thus, it is possible to reduce an area occupied by an RS latch by using a NOR gate with a simple structure including two transistors and a single resistance as described above. Therefore, it is possible to reduce an area occupied by a flip-flop, and to operate the flip-flop at a high speed due to a small number of transistors.

Figure 3A:
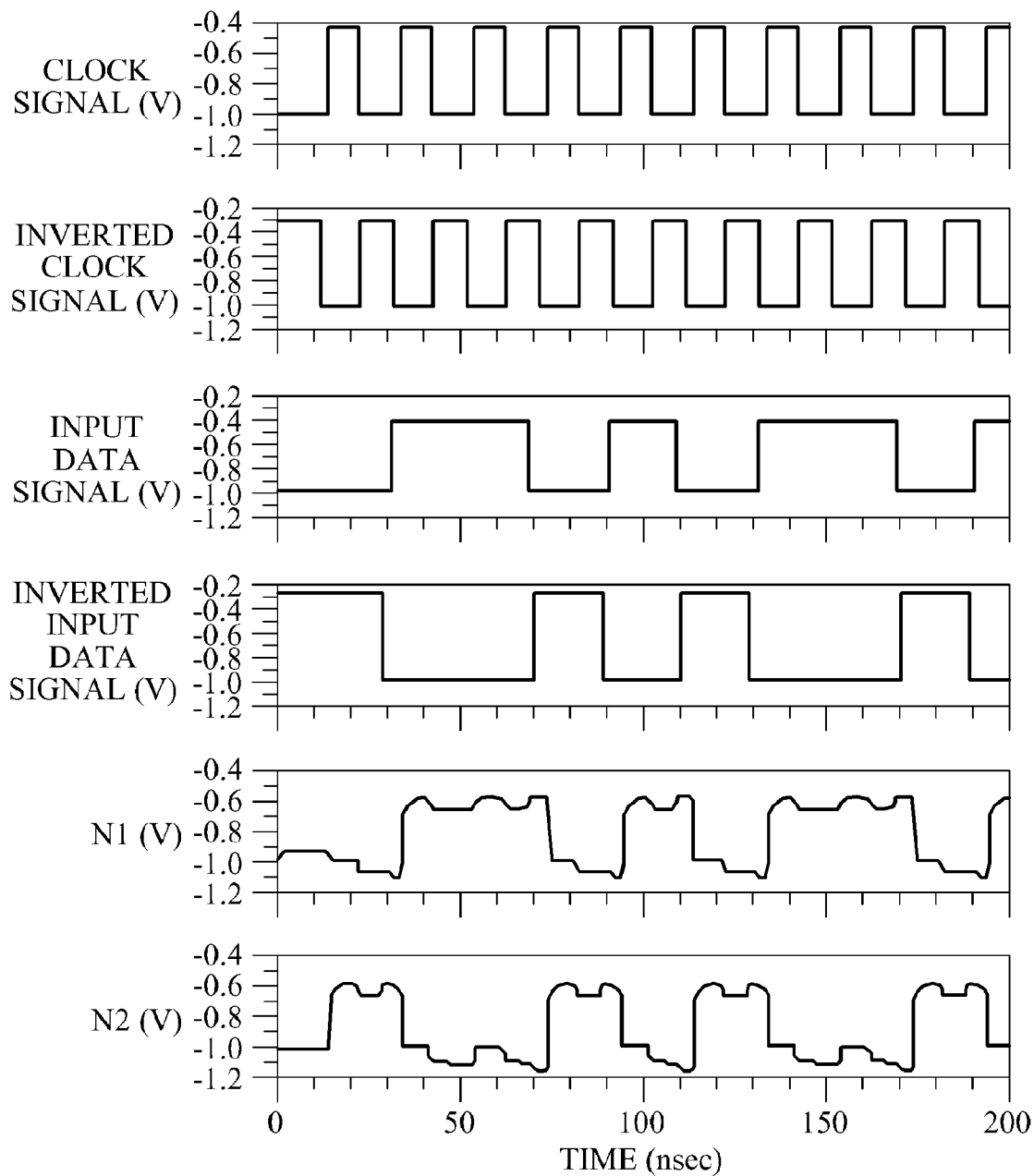
FIGS. 3A and 3B illustrate timing diagrams for a flip-flop according to an embodiment of the present invention.
Figure 3B:
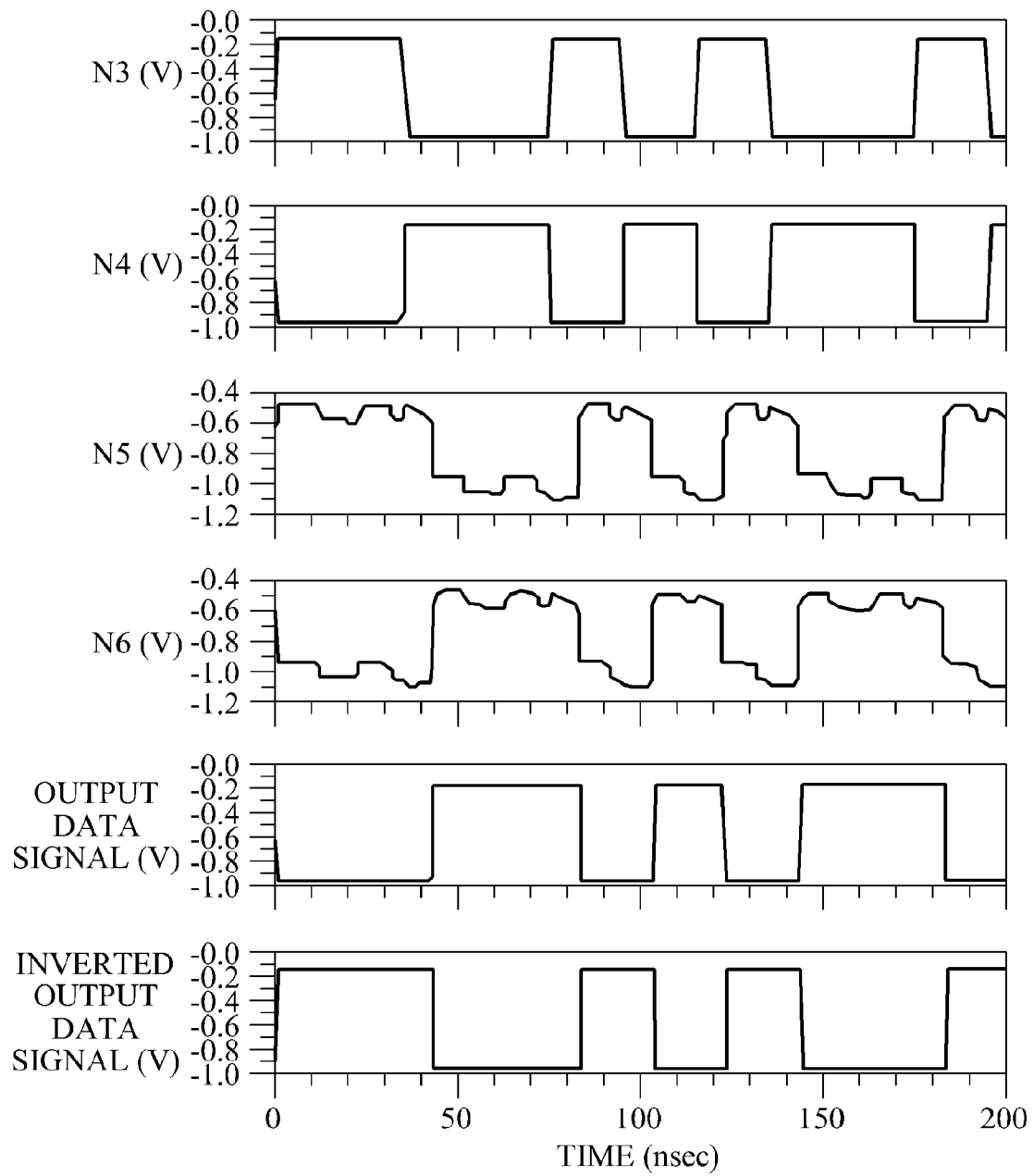

FIGS. 3A and 3B illustrate timing diagrams for a flip-flop according to an embodiment of the present invention.

Specifically, FIGS. 3A and 3B illustrate waveforms of nodes N1 through N6, an output data signal, and an inverted output data signal, when a clock signal, an inverted clock signal, an input data signal, and an inverted input data signal are input to the flip-flop.

The waveforms of FIGS. 3A and 3B may correspond to the above-described operation of the flip-flop. The flip-flop according to an embodiment of the present invention may store, in advance, an input data signal and an inverted input data signal, and may output the input data signal and inverted input data signal, respectively, as an output data signal and an inverted output data signal, on a falling edge of a clock signal. Additionally, the flip-flop may maintain levels of the outputted signals, until a subsequent falling edge of the clock signal. In other words, the flip-flop according to an embodiment of the present invention may exhibit characteristics of a negative-edge trigger.

Figure 4:
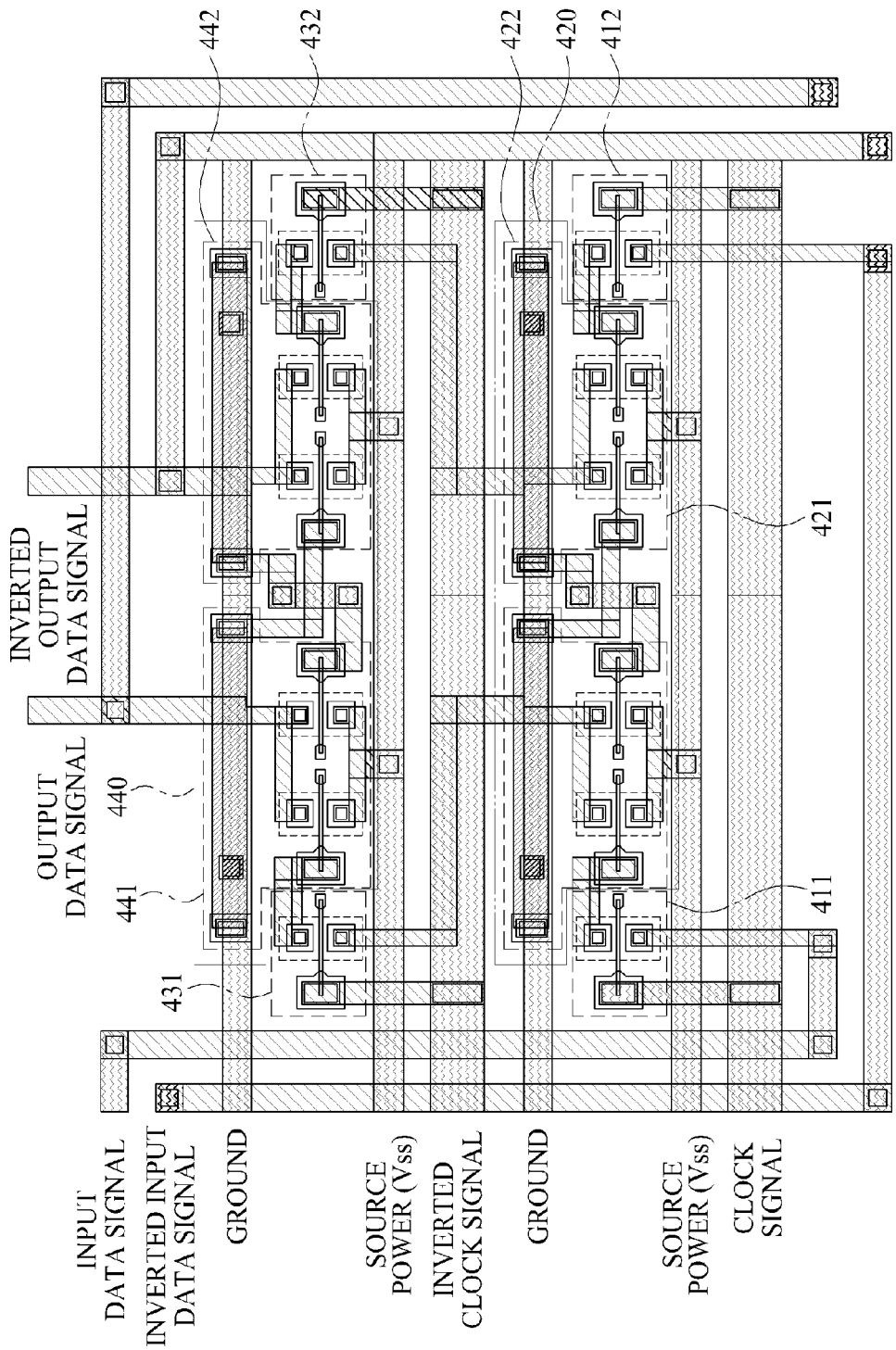
FIG. 4 is a diagram illustrating an example of a layout of a flip-flop according to an embodiment of the present invention.

FIG. 4 is a diagram illustrating an example of a layout of a flip-flop according to an embodiment of the present invention.

Specifically, FIG. 4 illustrates an example of a layout of a flip-flop circuit manufactured using a Gallium Arsenide (GaAs) compound semiconductor process. In FIG. 4, when a quadrangle is displayed on a portion where a horizontal line overlaps a vertical line, the two lines may be determined to be connected to each other.

An area 411, and an area 412 may respectively represent a first transistor, and a second transistor. The first transistor and the second transistor may be included in an input transistor unit.

An area 421, and an area 422 may respectively represent a first NOR gate, and a second NOR gate. An area 420 including the areas 421 and 422 may represent a first RS latch.

An area 431, and an area 432 may respectively represent a third transistor, and a fourth transistor. The third transistor and the fourth transistor may be included in an intermediate transistor unit.

An area 441, and an area 442 may respectively represent a third NOR gate and a fourth NOR gate. An area 440 including the areas 441 and 442 may represent a second RS latch.

Here, a connection relationship among the respective transistors and the respective NOR gates may be defined as described above with reference to FIGS. 1 and 2.

When the GaAs compound semiconductor process is used based on the above-described layout, the flip-flop circuit may be integrated together with a microwave frequency integrated circuit. Accordingly, it is possible to reduce a size, a weight, and manufacturing costs of a microwave frequency system, and to improve reliability of the microwave frequency system, without a need to manufacture, as a separate chip, a digital circuit for controlling the microwave frequency integrated circuit through a Complementary Metal-Oxide-Semiconductor (CMOS) process.

FIG. 5 is a flowchart illustrating a method of configuring a flip-flop circuit according to an embodiment of the present invention.

The method of FIG. 5 may include operation 510 of connecting an input data signal, an inverted input data signal, and a clock signal to an input of an input transistor unit including at least two transistors. Specifically, in operation 510, a first transistor may be connected between the input data signal and a first output of the input transistor unit, and a second transistor may be connected between the inverted input data signal and a second output of the input transistor unit. Additionally, the clock signal may be connected to a gate of the first transistor and a gate of the second transistor.

The method of FIG. 5 may include operation 520 of respectively connecting the first output and the second output of the input transistor unit to two inputs of a first RS latch. Specifically, in operation 520, a reset port of the first RS latch may be connected to the first output of the input transistor unit, and a set port of the first RS latch may be connected to the second output of the input transistor unit. Here, the first output and the second output of the input transistor unit may respectively correspond to the input data signal and the inverted input data signal that are input to the input transistor unit.

The method of FIG. 5 may include operation 530 of connecting two outputs of the first RS latch and an inverted clock signal to an input of an intermediate transistor unit including at least two transistors. Specifically, in operation 530, a third transistor may be connected between a first output of the first RS latch and a first output of the intermediate transistor unit, and a fourth transistor may be connected between a second output of the first RS latch and a second output of the intermediate transistor unit. Additionally, the inverted clock signal may be connected to a gate of the third transistor and a gate of the fourth transistor.

The method of FIG. 5 may include operation 540 of respectively connecting the first output and the second output of the intermediate transistor unit to two inputs of a second RS latch. Specifically, in operation 540, a reset port of the second RS latch may be connected to the first output of the intermediate transistor unit, and a set port of the second RS latch may be connected to the second output of the intermediate transistor unit. Here, the first output and the second output of the intermediate transistor unit may respectively correspond to an output signal and an inverted output signal of the first RS latch that are input to the intermediate transistor unit.

Here, each of the first RS latch and the second RS latch may use a NOR gate. The NOR gate may include a resistance, a fifth transistor, and a sixth transistor. The resistance may be connected between a ground and an output of the NOR gate, and the fifth transistor may be used to receive, as input, a first input through a gate of the fifth transistor and may be connected between a source power $V_{ss}$ and the output of the NOR gate. The sixth transistor may be used to receive, as input, a second input through a gate of the sixth transistor, and may be connected between the source power $V_{ss}$ and the output of the NOR gate.

The method of configuring the flip-flop circuit has been described above. Descriptions described in various embodiments with reference to FIGS. 1 through 4 may be applicable to the method of configuring the flip-flop circuit and thus, further descriptions thereof will be omitted herein.

The methods according to the embodiments of the present invention may be recorded in non-transitory computer-readable media including program instructions to implement various operations embodied by a computer. The media may also include, alone or in combination with the program instructions, data files, data structures, and the like. The program instructions recorded on the media may be those specially designed and constructed for the purposes of the embodiments, or they may be of the kind well-known and available to those having skill in the computer software arts. Examples of non-transitory computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A flip-flop comprising:
   a first RS latch including a first pair of NOR gates; and
   a second RS latch including a second pair of NOR gates;
   wherein each of the NOR gates employed in the first RS latch and the second RS latch comprises:
      a resistance connected between a ground and an output of the NOR gate;
      a fifth transistor to receive, as input, a first input through a gate of the fifth transistor, the fifth transistor being connected between a source power $V_{ss}$ and the output of the NOR gate; and
      a sixth transistor to receive, as input, a second input through a gate of the sixth transistor, the sixth transistor being connected between the source power $V_{ss}$ and the output of the NOR gate;
   an input transistor unit to receive, as inputs, an input data signal, an inverted input data signal, and a clock signal, and to provide two outputs to the first RS latch when being connected to an input port of the first RS latch,
   wherein the input transistor unit comprises:
      a first transistor to receive, as input, the clock signal through a gate of the first transistor, the first transistor being connected between the input data signal and a first output of the input transistor unit; and
      a second transistor to receive, as input, the clock signal through a gate of the second transistor, the second transistor being connected between the inverted input data signal and a second output of the input transistor unit; and
   an intermediate transistor unit to receive, as inputs, two outputs of the first RS latch and an inverted clock signal, and to provide two outputs to the second RS latch when being connected to an input port of the second RS latch,
   wherein the intermediate transistor unit comprises:
      a third transistor to receive, as input, the inverted clock signal through a gate of the third transistor, the third transistor being connected between a first output of the first RS latch and a first output of the intermediate transistor unit; and
      a fourth transistor to receive, as input, the inverted clock signal through a gate of the fourth transistor, the fourth transistor being connected between a second output of the first RS latch and a second output of the intermediate transistor unit.

2. The flip-flop of claim 1, wherein the first RS latch receives, as inputs, two outputs of the input transistor unit through a set port and a reset port, and provides an output of an output port and an output of an inverted output port to two inputs of the intermediate transistor unit.

3. The flip-flop of claim 2,
   wherein the reset port is connected to the first output of the input transistor unit, the first output corresponding to the input data signal that is input to the input transistor unit, and
   wherein the set port is connected to the second output of the input transistor unit, the second output corresponding to the inverted input data signal that is input to the input transistor unit.

4. The flip-flop of claim 1, wherein the second RS latch receives, as inputs, two outputs of the intermediate transistor unit through a set port and a reset port, and outputs an output data signal and an inverted output data signal through an output port and an inverted output port.

5. The flip-flop of claim 4,
   wherein the reset port is connected to the first output of the intermediate transistor unit, the first output corresponding to a signal of an output port of the first RS latch that is input to the intermediate transistor unit, and
   wherein the set port is connected to the second output of the intermediate transistor unit, the second output corresponding to a signal of an inverted output port of the first RS latch that is input to the intermediate transistor unit.

6. A method of forming a flip-flop, the method comprising:
   connecting an input data signal, an inverted input data signal, and a clock signal to an input of an input transistor unit, further comprising:
      connecting a first transistor between the input data signal and a first output of the input transistor unit;
      connecting a second transistor between the inverted input data signal and a second output of the input transistor unit; and
      connecting the clock signal to a gate of the first transistor and a gate of the second transistor;
   respectively connecting two outputs of the input transistor unit to two inputs of a first RS latch including a first pair of NOR gates;
   connecting two outputs of the first RS latch and an inverted clock signal to an input of an intermediate transistor unit, further comprising:
      connecting a third transistor between a first output of the first RS latch and a first output of the intermediate transistor unit;
      connecting a fourth transistor between a second output of the first RS latch and a second output of the intermediate transistor unit; and
      connecting the inverted clock signal to a gate of the third transistor and a gate of the fourth transistor; and
   respectively connecting two outputs of the intermediate transistor unit to two inputs of a second RS latch including a second pair of NOR gates,
   wherein each of the NOR gates employed in the first RS latch and the second RS latch comprises:
      a resistance connected between a ground and an output of the NOR gate;
      a fifth transistor to receive, as input, a first input through a gate of the fifth transistor, the fifth transistor being connected between a source power $V_{ss}$ and the output of the NOR gate; and
      a sixth transistor to receive, as input, a second input through a gate of the sixth transistor, the sixth transistor being connected between the source power $V_{ss}$ and the output of the NOR gate.

7. The method of claim 6, wherein the respectively connecting of the two outputs of the input transistor unit comprises:
   connecting a reset port of the first RS latch to the first output of the input transistor unit, the first output corresponding to the input data signal that is input to the input transistor unit; and
   connecting a set port of the first RS latch to the second output of the input transistor unit, the second output corresponding to the inverted input data signal that is input to the input transistor unit.

8. The method of claim 6, wherein the respectively connecting of the two outputs of the intermediate transistor unit comprises:
   connecting a reset port of the second RS latch to the first output of the intermediate transistor unit, the first output corresponding to an output signal of the first RS latch that is input to the intermediate transistor unit; and
   connecting a set port of the second RS latch to the second output of the intermediate transistor unit, the second output corresponding to an inverted output signal of the first RS latch that is input to the intermediate transistor unit.

* * * * *